(12) United States Patent
Jung

(10) Patent No.: US 11,937,364 B2
(45) Date of Patent: Mar. 19, 2024

(54) HIGHLY HEAT-DISSIPATING FLEXIBLE PRINTED CIRCUIT BOARD (GFPCB), MANUFACTURING METHOD THEREFOR, AND LED LAMP FOR VEHICLE

(71) Applicants: Seong Hwan Jung, Incheon (KR); SOLUETA, Hwaseong-si (KR)

(72) Inventor: Seong Hwan Jung, Incheon (KR)

(73) Assignees: Seong Hwan Jung, Incheon (KR); SOLUETA, Hwaseong-si (KR)

( * ) Notice: Subject to any disclaimer, the term of this patent is extended or adjusted under 35 U.S.C. 154(b) by 369 days.

(21) Appl. No.: 17/358,122

(22) Filed: Jun. 25, 2021

(65) Prior Publication Data
US 2021/0321509 A1 Oct. 14, 2021

Related U.S. Application Data

(63) Continuation of application No. PCT/KR2020/000307, filed on Jan. 8, 2020.

(30) Foreign Application Priority Data

Jan. 9, 2019 (KR) .................... 10-2019-0002737

(51) Int. Cl.
*B32B 7/12* (2006.01)
*B32B 9/00* (2006.01)
(Continued)

(52) U.S. Cl.
CPC .............. *H05K 1/0209* (2013.01); *B32B 7/12* (2013.01); *B32B 9/007* (2013.01); *F21S 41/32* (2018.01);
(Continued)

(58) Field of Classification Search
CPC ............. B32B 7/12; B32B 9/007; B32B 9/00; F21S 41/151; F21S 41/192; F21S 41/32;
(Continued)

(56) References Cited

U.S. PATENT DOCUMENTS

| 7,140,757 B2 | 11/2006 | Sakai | |
| 2010/0124627 A1* | 5/2010 | Nonaka | C09J 7/385 |
| | | | 428/41.8 |
| 2010/0158612 A1* | 6/2010 | Chiu | B09C 1/08 |
| | | | 210/757 |

(Continued)

FOREIGN PATENT DOCUMENTS

| JP | 4433789 B2 | 3/2010 | |
| KR | 20120064384 A * | 6/2012 | ............. B32B 15/08 |

(Continued)

OTHER PUBLICATIONS

International Search Report and Written Opinion for International Application No. PCT/KR2020/000307 dated Apr. 23, 2020, 5 pages.

*Primary Examiner* — Timothy J Thompson
*Assistant Examiner* — Guillermo J Egoavil
(74) *Attorney, Agent, or Firm* — Finch & Maloney PLLC

(57) ABSTRACT

A highly heat-dissipating flexible printed circuit board (GFPCB) efficiently emits heat transferred from a heat source such as an LED to the flexible printed circuit board. The highly heat-dissipating flexible printed circuit board comprises: a flexible board layer which is formed in a flexibly bendable thin-film form by bonding a polyimide (PI) film to the lower side of a copper (Cu) film using an adhesive and has a heat element installed on the upper side thereof; and a heat dissipation layer which is formed in a thin-film form by coating any one of graphitic carbon and a graphite powder binder on the upper side of an aluminum (Al) film and is bonded to the lower side of the flexible board layer using a pressure sensitive adhesive (PSA) to receive heat generated and transferred from the heat element and emit the heat to the outside.

9 Claims, 18 Drawing Sheets

(51) Int. Cl.
*F21S 41/32* (2018.01)
*H05K 1/02* (2006.01)

(52) U.S. Cl.
CPC ..... *H05K 1/028* (2013.01); *H05K 2201/0154* (2013.01); *H05K 2201/0358* (2013.01); *H05K 2201/10106* (2013.01)

(58) Field of Classification Search
CPC .......... F21S 43/14; F21S 43/15; F21S 43/195; F21S 45/47; H05K 1/0209; H05K 1/0277; H05K 1/028; H05K 1/02; H05K 2201/0154; H05K 2201/0358; H05K 2201/053; H05K 2201/056; H05K 2201/10106; H05K 3/0061; H05K 3/0067
USPC ........................................................ 361/704
See application file for complete search history.

(56) References Cited

U.S. PATENT DOCUMENTS

| | | | |
|---|---|---|---|
| 2017/0098598 A1* | 4/2017 | Otremba | H01L 23/3107 |
| 2017/0250152 A1* | 8/2017 | Scharf | H01L 23/5383 |
| 2020/0411901 A1* | 12/2020 | Dong | H01M 10/0525 |

FOREIGN PATENT DOCUMENTS

| | | | | |
|---|---|---|---|---|
| KR | 10-1435451 B1 | 8/2014 | | |
| KR | 10-1533013 B1 | 7/2015 | | |
| KR | 10-1542945 B1 | 9/2015 | | |
| KR | 10-1796206 B1 | 11/2017 | | |
| KR | 10-1805556 B1 | 12/2017 | | |
| KR | 20180097264 A | * | 8/2018 | ............ B32B 15/04 |
| KR | 10-2018-0127148 A | 11/2018 | | |
| WO | 2020145644 A1 | 7/2020 | | |

\* cited by examiner

[Fig. 1]
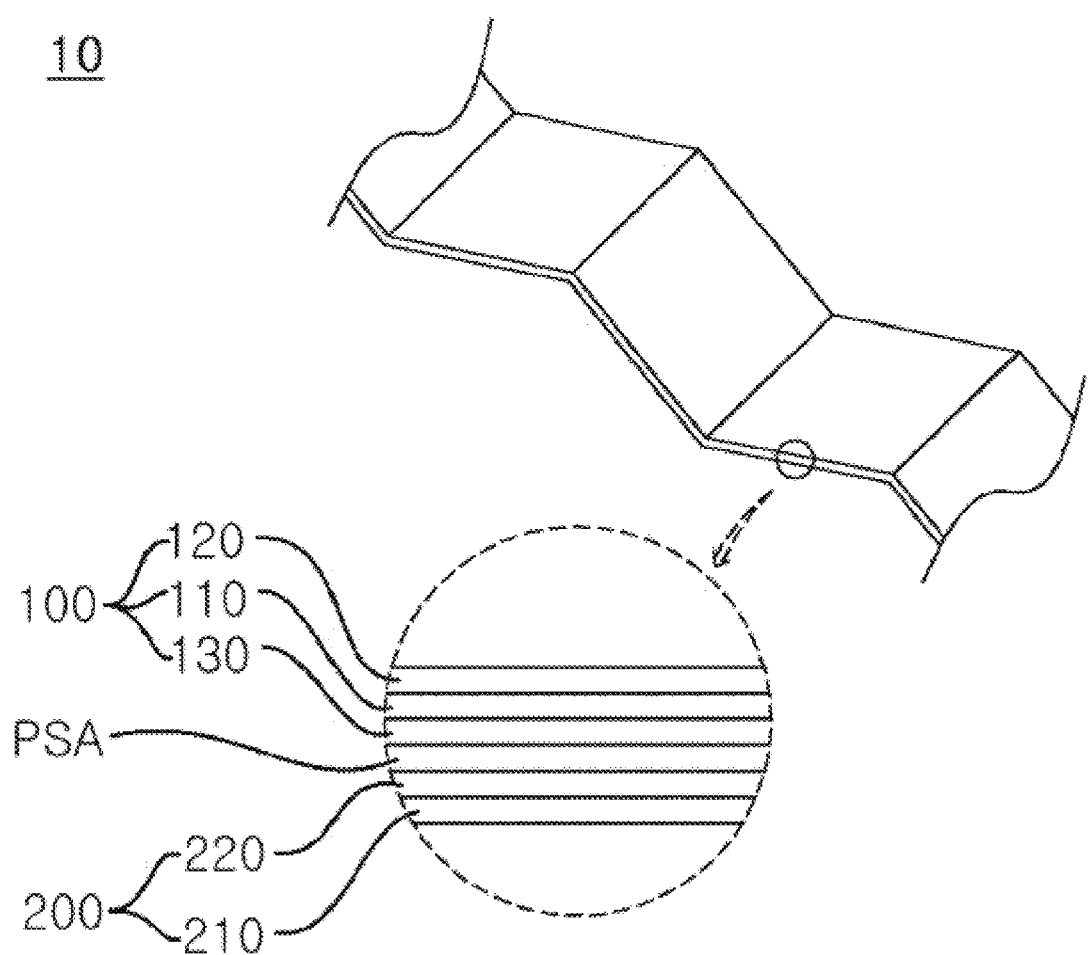

[Fig. 2]
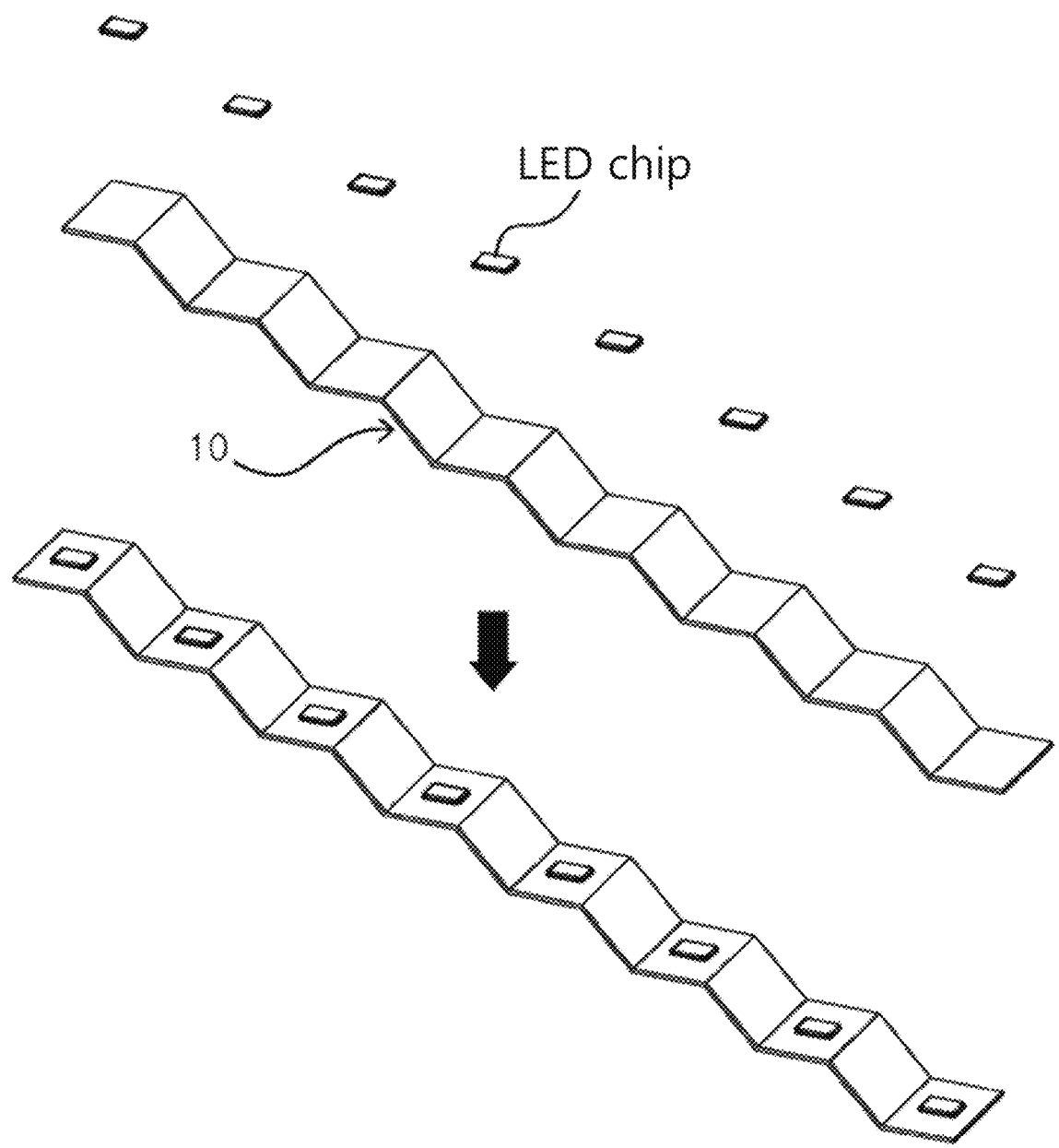

[Fig. 3a] Prior Art
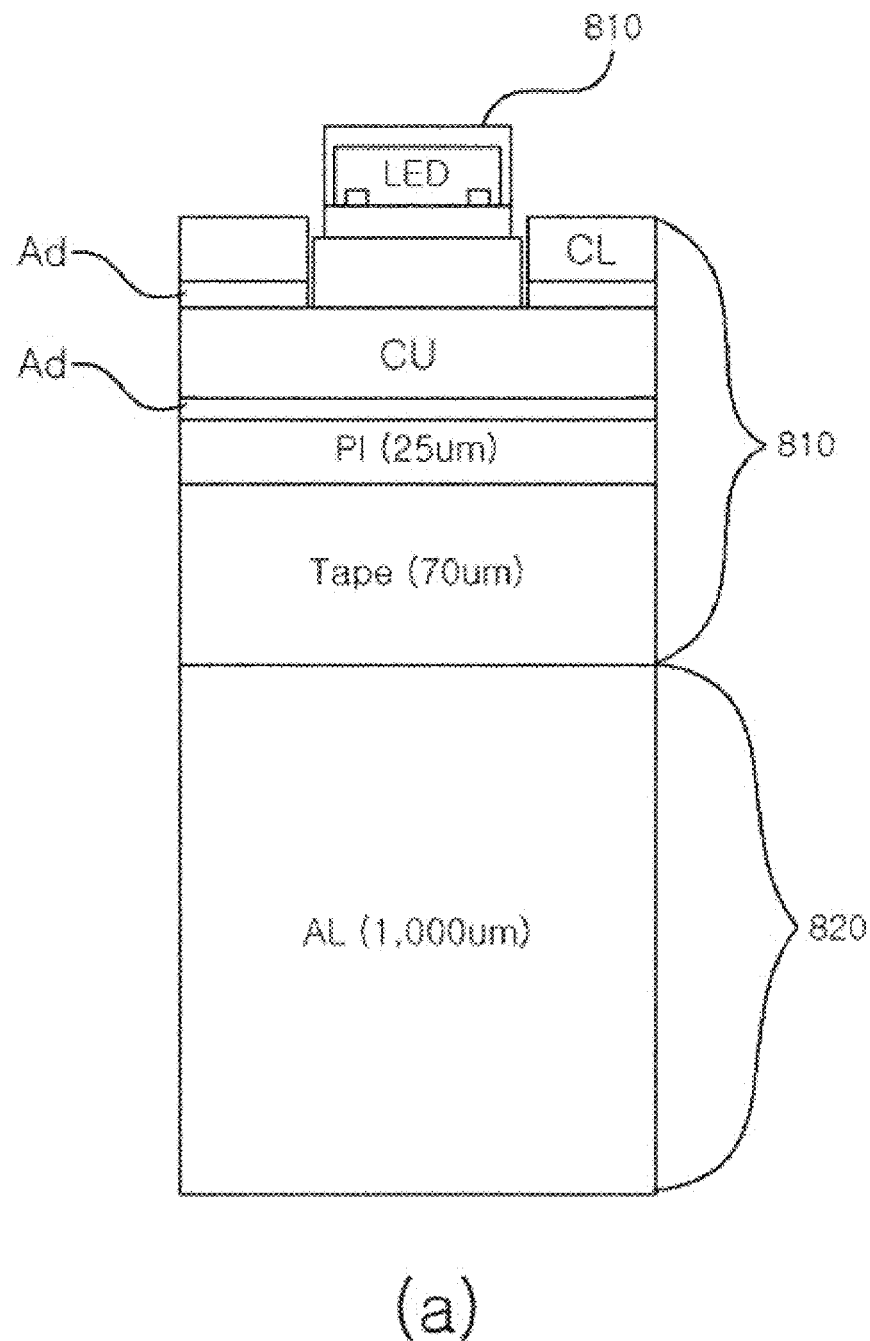
(a)

[Fig. 3b] Prior Art
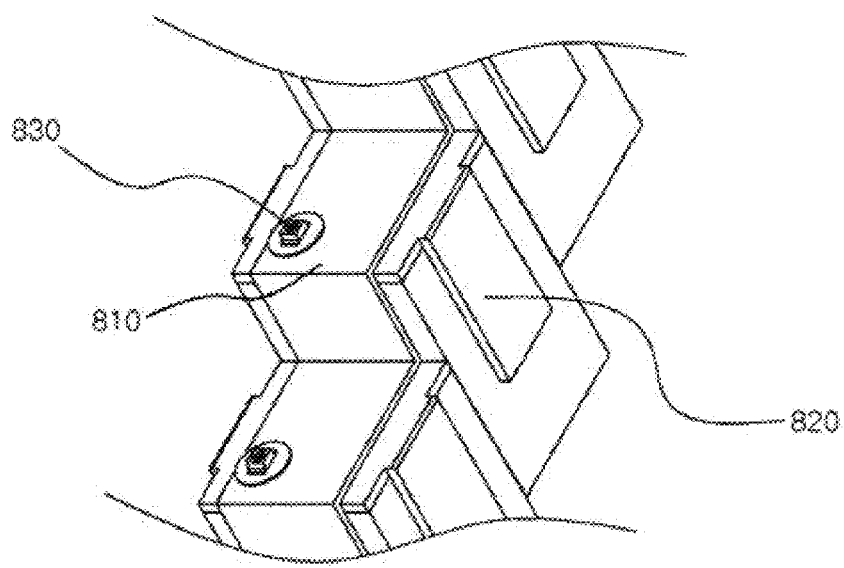
(b)

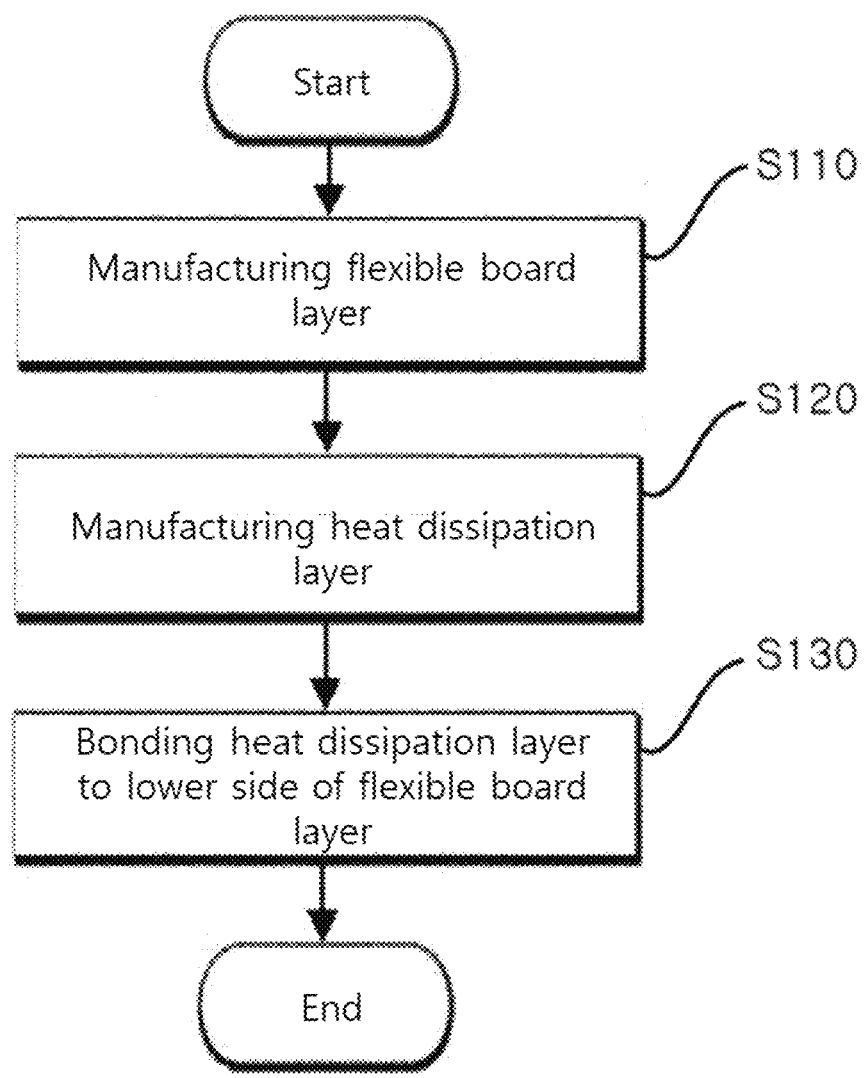
[Fig. 6]

[Fig. 7]
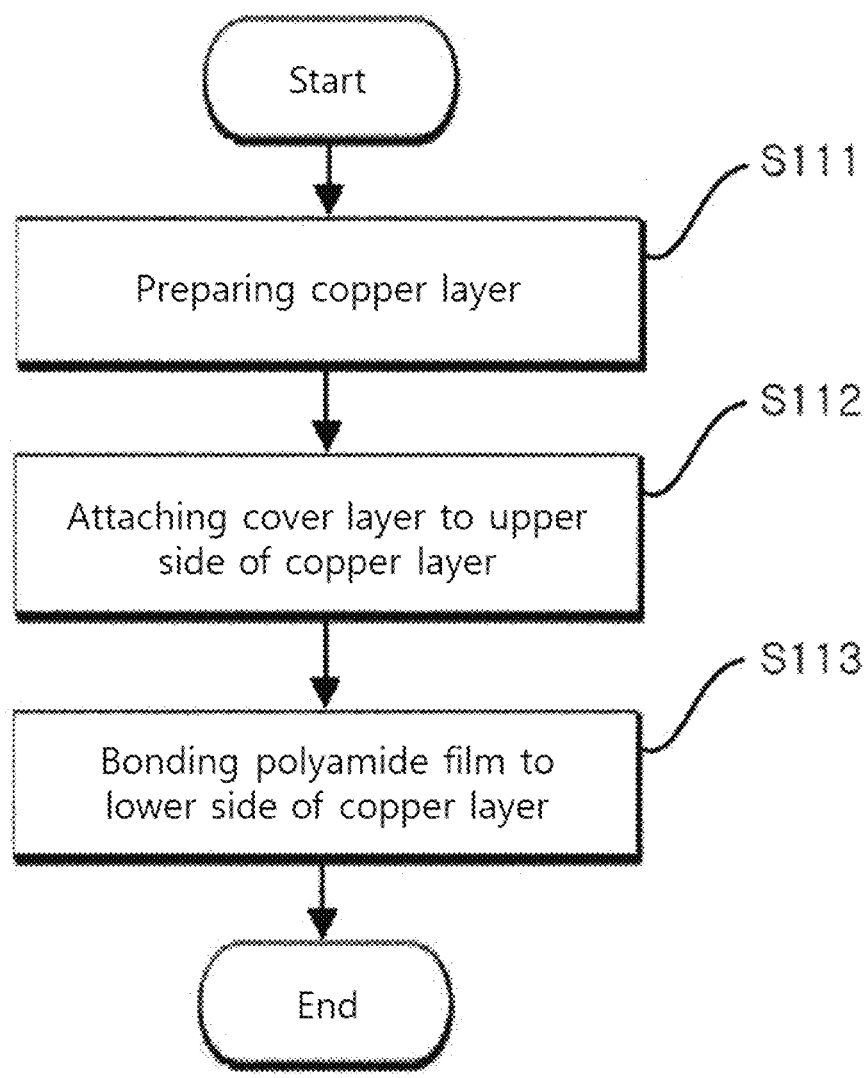

[Fig. 8]
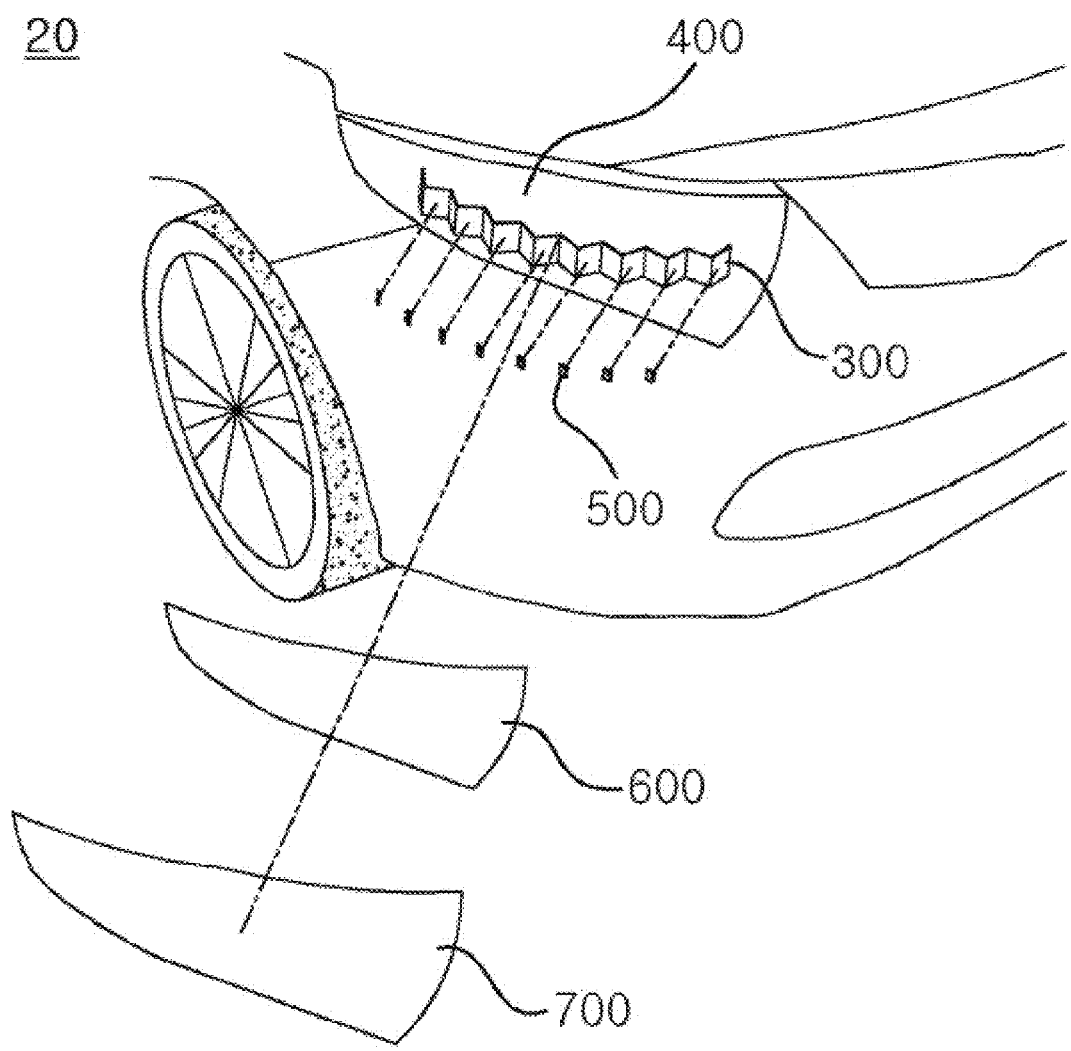

[Fig. 9]
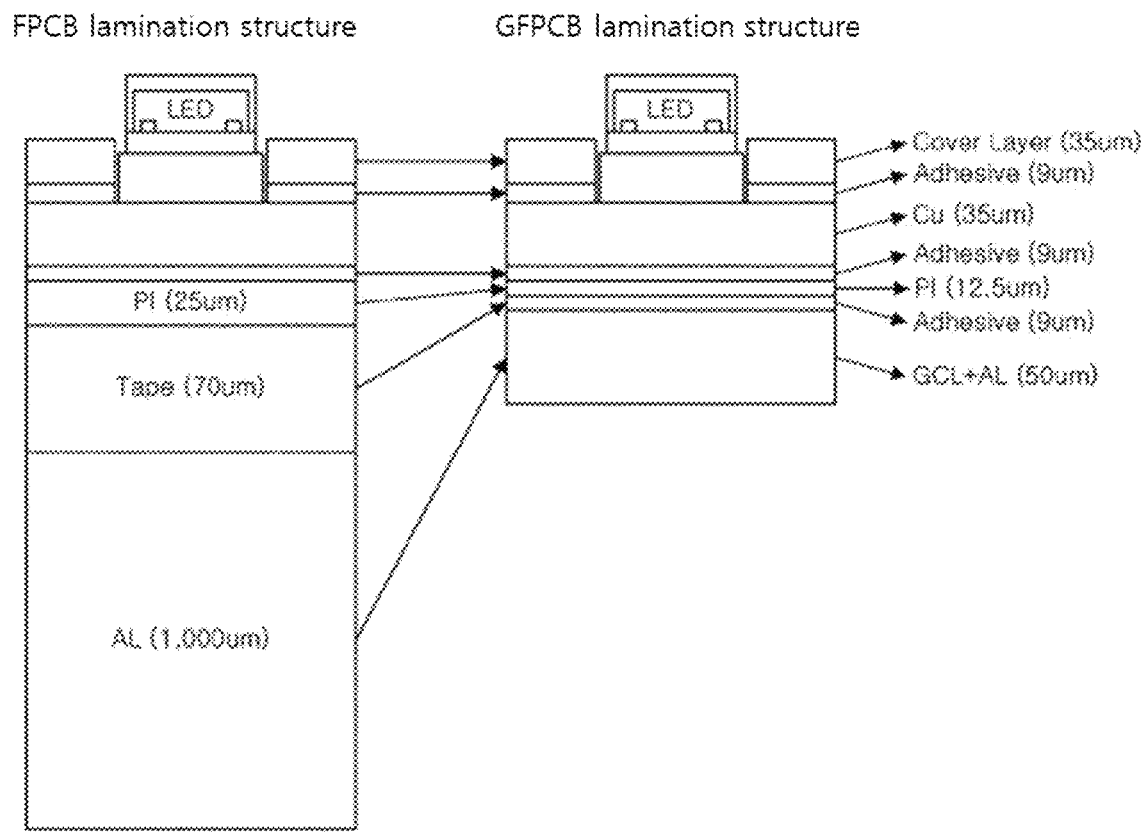

[Fig. 10]   Prior Art
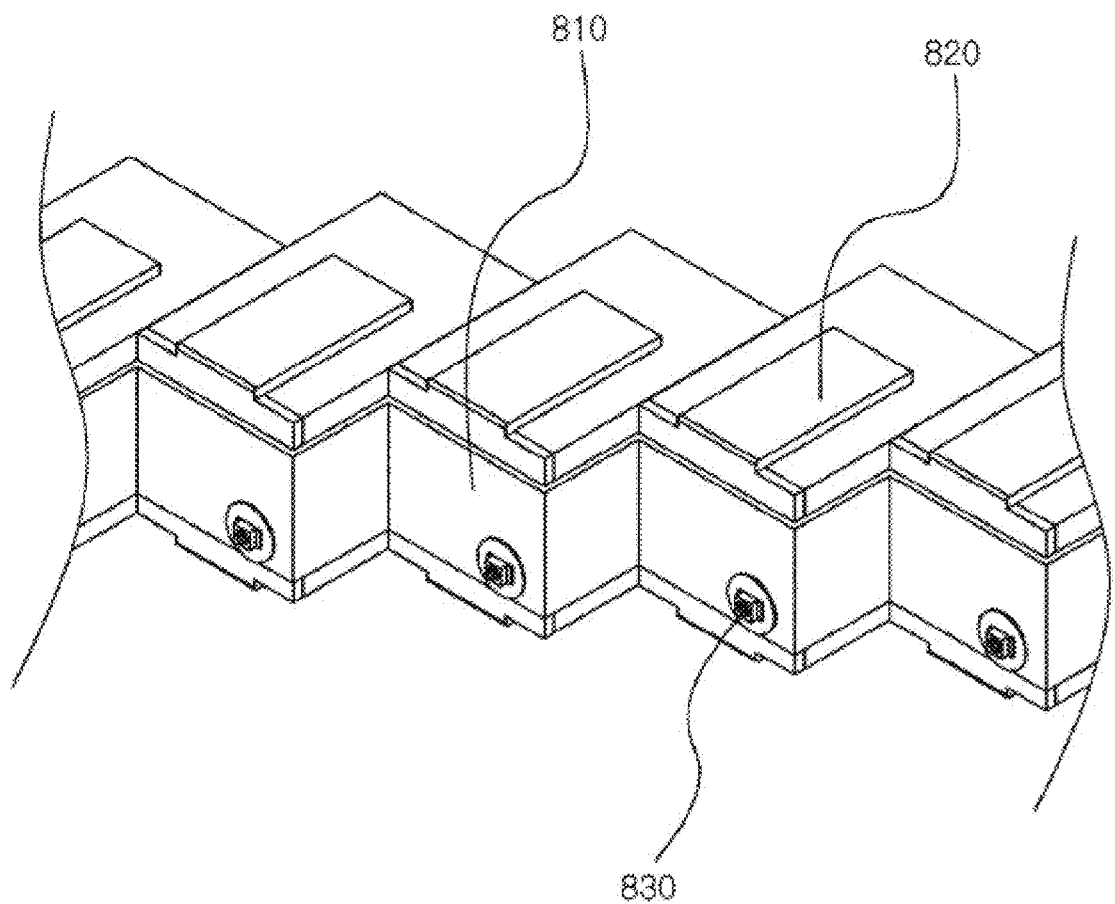

[Fig. 11] Prior Art
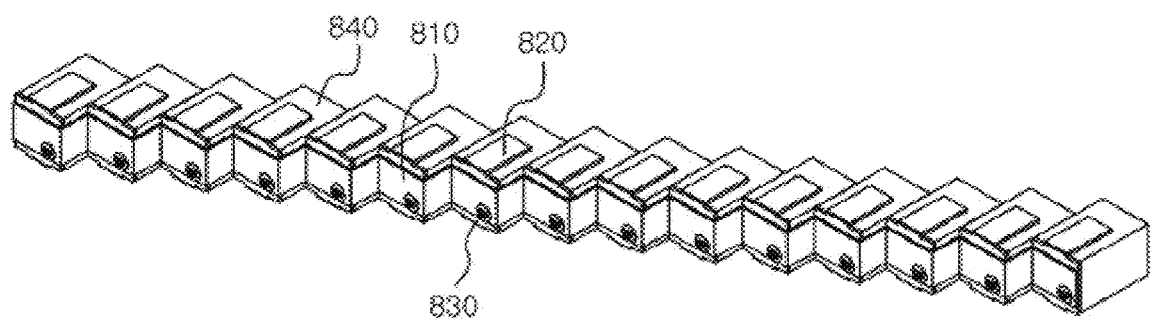

[Fig. 12]
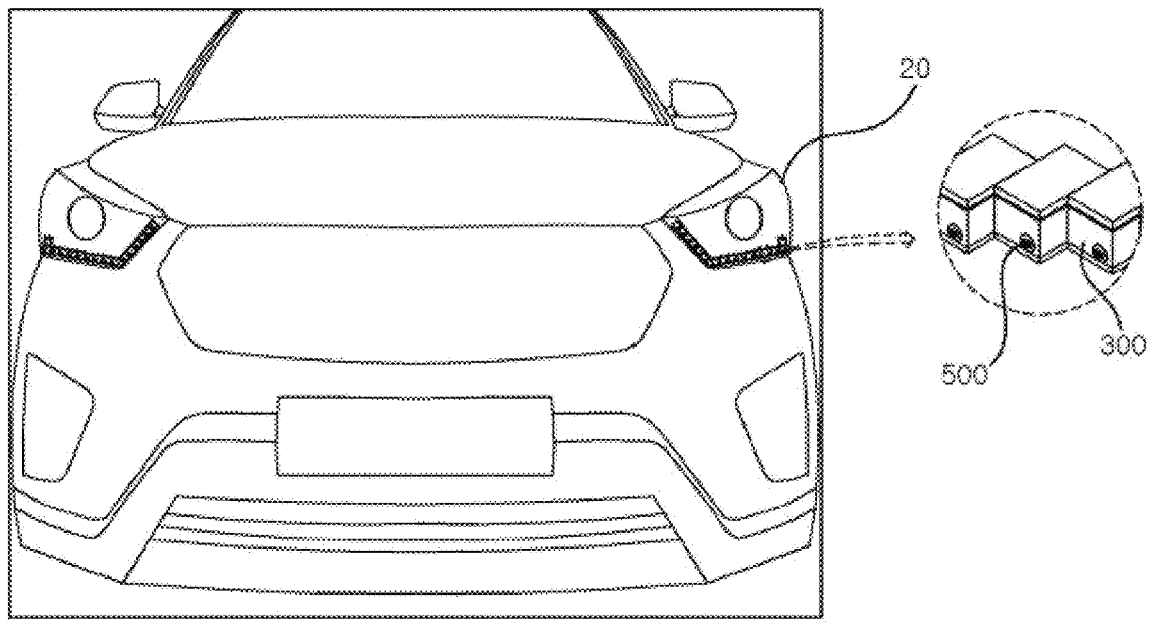

[Fig. 13]
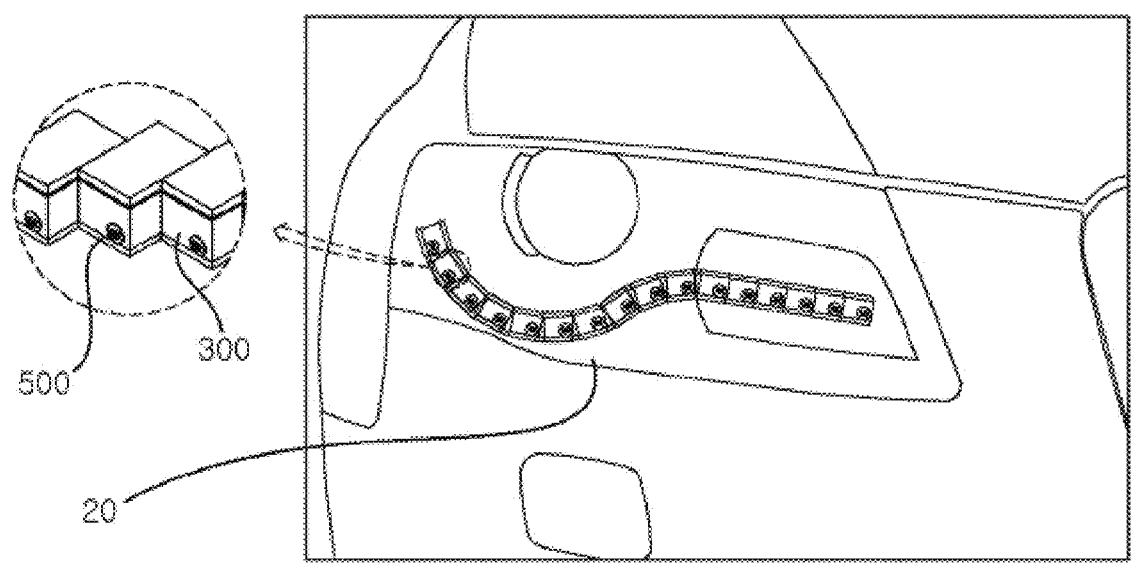

[Fig. 14]
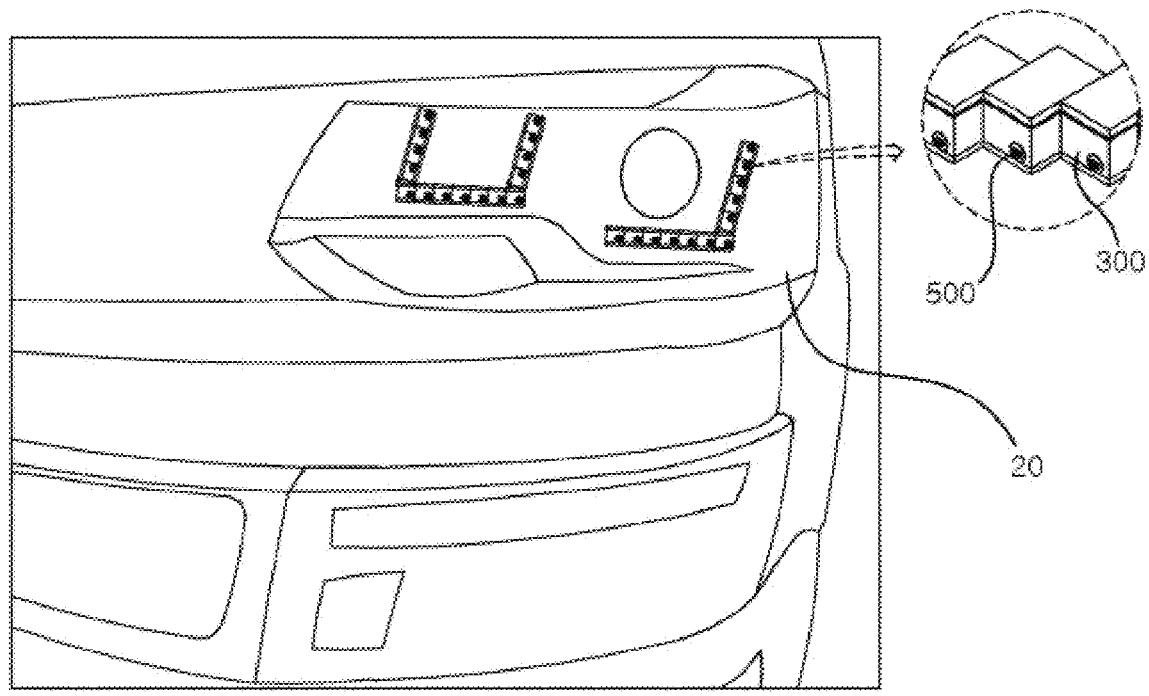

[Fig. 15]
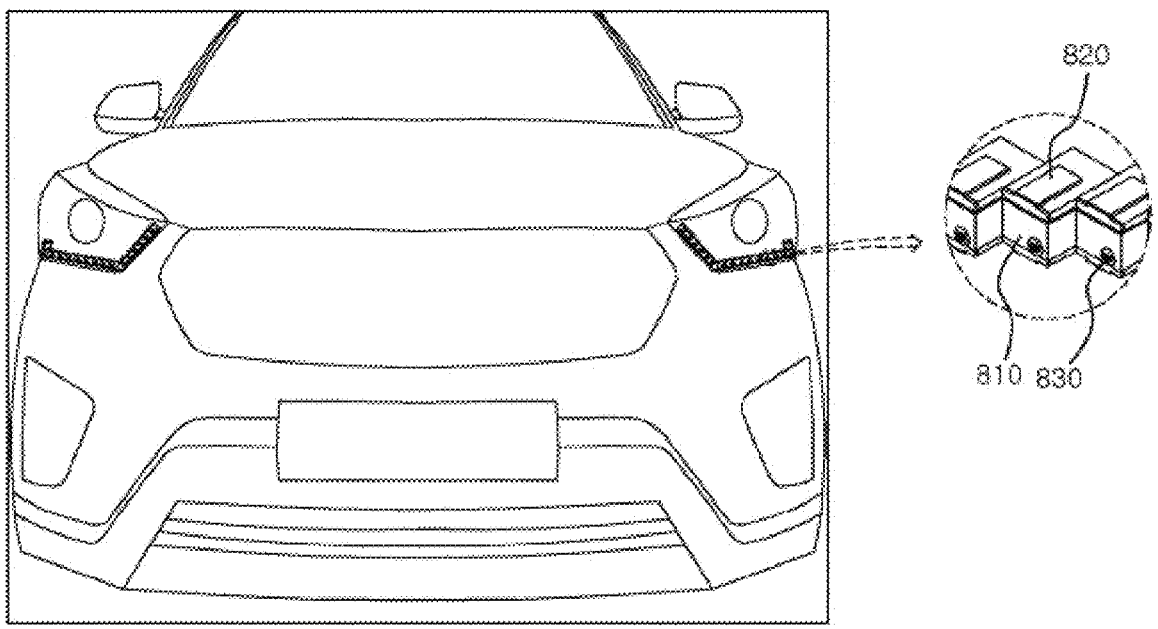

[Fig. 16]
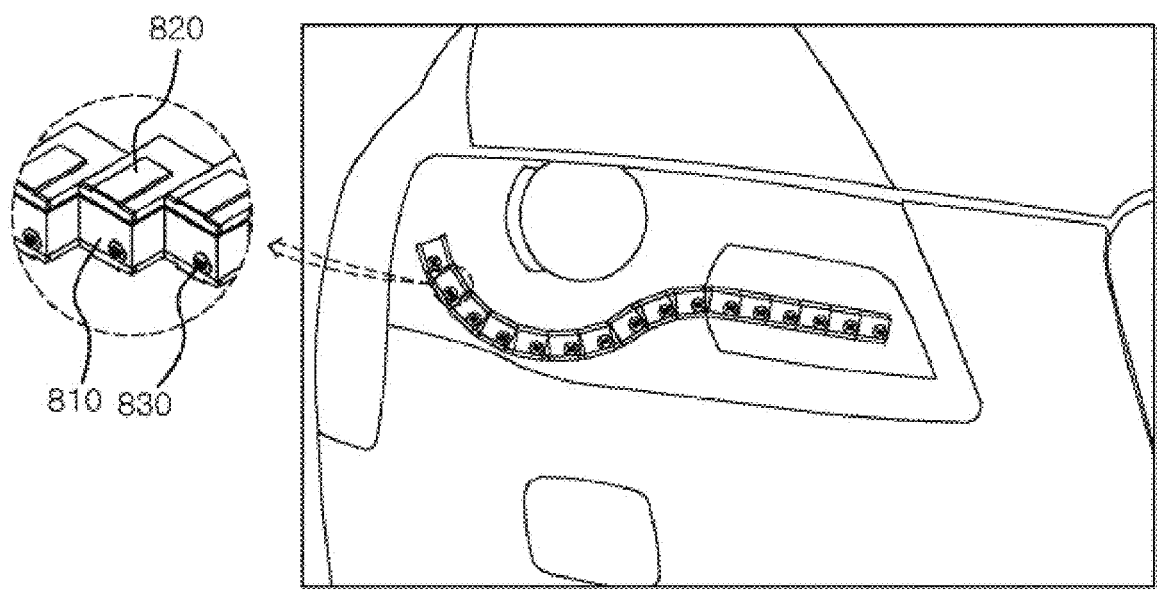

[Fig. 17]
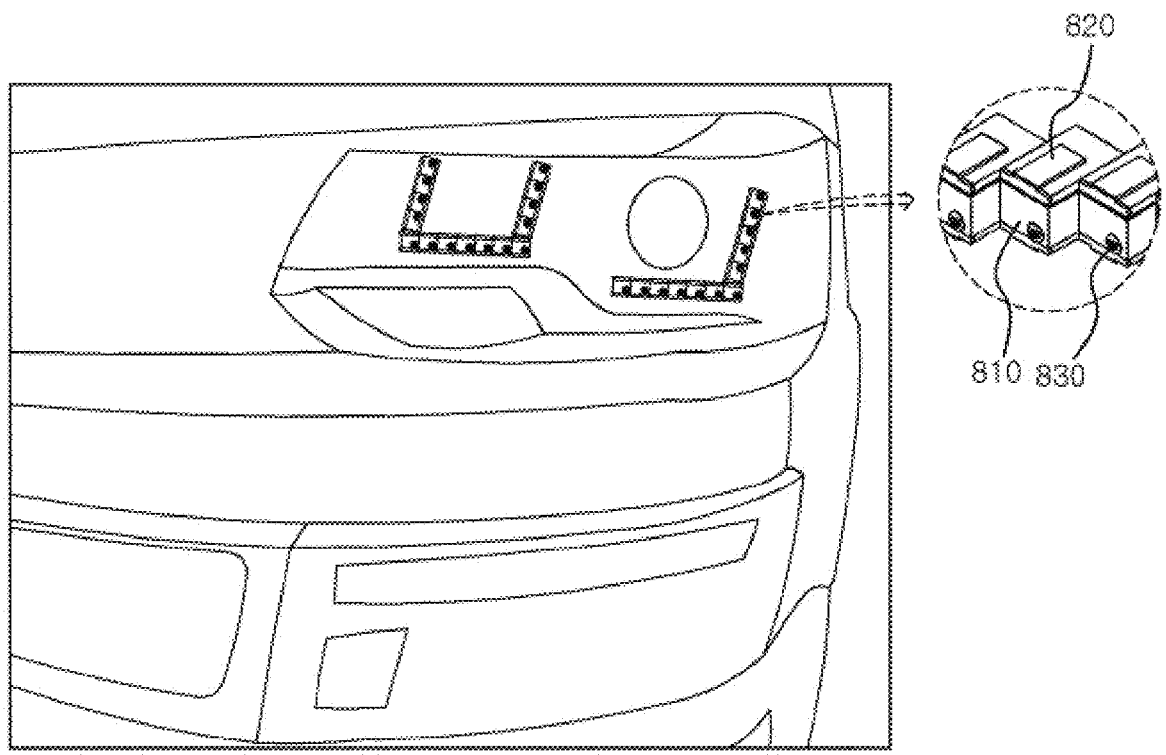

HIGHLY HEAT-DISSIPATING FLEXIBLE PRINTED CIRCUIT BOARD (GFPCB), MANUFACTURING METHOD THEREFOR, AND LED LAMP FOR VEHICLE

TECHNICAL FIELD

The present invention relates to a highly heat-dissipating flexible printed circuit board (GFPCB), a manufacturing method therefor, and an LED lamp for a vehicle, and more particularly, to a highly heat-dissipating flexible printed circuit board (GFPCB) implemented to efficiently emit heat transferred from a heat source such as a light emitting diode (LED) to the flexible printed circuit board, a manufacturing method therefor, and an LED lamp for a vehicle.

BACKGROUND ART

In general, because vehicular electric lightings, such as head lamps, daytime running lamps (DRL), and rear combination lamps (RCL), have a curved surface or rounded curved part, a flat-type printed circuit board cannot be used, and a flexible printed circuit board is required to be applied.

In this regard, the board used for the conventional electric vehicle lightings is manufactured by manually bonding a flexible printed circuit board (FPCB) to an individually cut aluminum plate.

The aluminum plate performs a heat dissipation function, and the heat dissipation property of the flexible printed circuit board is not excellent due to low thermal conductivity in the related art. In other words, according to the related art, a polyimide film is usually used as an insulating layer for the flexible printed circuit board. Since the thermal conductivity of the polyimide film is low, the heat dissipation property is also inevitably reduced.

In addition, according to the related art, since the aluminum plate is required to be individually processed as described above, the process of bonding the flexible printed circuit board to the aluminum plate is essentially required, and a double-sided tape manually adheres in the process of bonding the aluminum heat dissipation plate, serious deterioration may be caused to the heat dissipation performance, the manufacturing process may be complicated and the manufacturing cost may be increased.

(Patent Document 1) Korean Patent Registration No. 10-1435451

(Patent Document 2) Korean Patent Registration No. 10-1533013

DISCLOSURE

Technical Problem

One aspect of the present invention provides a highly heat-dissipating flexible printed circuit board (GFPCB), a manufacturing method therefor, and an LED lamp for a vehicle, which are implemented to efficiently emit heat transferred from a heat source such as an LED to the flexible printed circuit board by using a thin-film heat dissipation layer instead of an aluminum heat dissipation plate occupying a lot of volume and weight.

Technical problems of the present invention are not limited to the above-mentioned technical problem, and other technical problems not mentioned herein may be apparently understood by those skilled in the art based on the following descriptions.

Technical Solution

The highly heat-dissipating flexible printed circuit board (GFPCB) according to one embodiment of the present invention includes: a flexible board layer which is formed in a flexibly bendable thin-film form by bonding of a polyimide (PI) film to a lower side of a copper (Cu) film using an adhesive, and has a heat element installed on the upper side thereof; and a heat dissipation layer formed in a thin-film form by coating of any one of graphitic carbon and a graphite powder binder on the upper side of an aluminum (Al) film and bonded to the lower side of the flexible board layer using a pressure sensitive adhesive (PSA) to receive heat generated and transferred from the heat element and emit the heat to the outside.

In one embodiment, the flexible board layer may include: a copper layer formed of a copper (Cu) film; a cover layer covering an upper side of the copper layer; and a polyimide layer formed of a polyimide (PI) film and bonded to a lower side of the copper layer using an adhesive.

In one embodiment, the flexible board layer may further include a graphite powder layer formed by using binder between the polyimide layer and the pressure sensitive adhesive for bonding the heat dissipation layer to the lower side of the polyimide layer.

In one embodiment, the heat dissipation layer may include: an aluminum layer formed of an aluminum (Al) film; and a graphitic carbon layer formed by coating graphite carbon on an upper side of the aluminum layer.

The LED lamp for a vehicle according to one embodiment of the present invention includes: the highly heat-dissipating flexible printed circuit board (GFPCB) according to one embodiment of the present invention; a base housing forming a space for installing a lamp in a vehicle, and installed with the highly heat-dissipating flexible circuit board (GFPCB) in the space; an LED module provided with a plurality of LEDs emitting light, and installed on a front surface of the highly heat-dissipating flexible circuit board (GFPCB); a dispersion plate installed at a front end of the LED module to disperse light emitted from the LED; and a cover for covering the space formed by the base housing while transmitting the light dispersed by the dispersion plate.

The manufacturing method for the highly heat-dissipating flexible printed circuit board (GFPCB) according to one embodiment of the present invention includes the steps of: manufacturing a flexible board layer in the form of a flexibly bent thin film by bonding a polyimide (PI) film to a lower side of a copper (Cu) film using an adhesive; manufacturing a heat dissipation layer in the form of a thin film by coating any one of graphitic carbon and graphite powder binder on an upper side of an aluminum (Al) film; and bonding the heat dissipation layer to a lower side of the flexible board layer by using a pressure sensitive adhesive (PSA).

In one embodiment, the manufacturing of the highly heat-dissipating flexible printed circuit board may include: preparing a copper layer formed of a copper (Cu) film; covering a cover layer on an upper side of the copper layer; and bonding a polyimide (PI) film to a lower side of the copper layer by using an adhesive.

In one embodiment, the manufacturing method for the highly heat-dissipating flexible printed circuit board (GFPCB) according to one embodiment of the present invention, before the bonding by using the pressure sensitive adhesive, may further include forming a graphite powder layer formed by using binder between the polyimide layer of the flexible board layer and the pressure sensitive adhesive for bonding the heat dissipation layer to the lower side of the polyimide layer.

In one embodiment, the manufacturing method for the highly heat-dissipating flexible printed circuit board (GFPCB) according to one embodiment of the present invention, before the bonding by using the pressure sensitive adhesive, may further include forming a graphitic carbon layer between the polyimide layer of the flexible board layer and the pressure sensitive adhesive for bonding the heat dissipation layer to the lower side of the polyimide layer.

Advantageous Effects

According to one aspect of the present invention as described, the thin-film heat dissipation layer is used instead of a voluminous, expensive and heavy aluminum heat dissipation plate, so that the heat transferred to the flexible printed circuit board from the heat sources such as the LEDs can be efficiently dissipated, and the thickness and weight of the heat dissipation layer can be remarkably reduced even at a low cost.

In addition, the freely deformable thin-film heat dissipation layer is used instead of aluminum unsuitable for the process such as bending, so that deformation processing can be easily performed according to shapes of devices to be applied, and the present invention can be used in more various devices.

DESCRIPTION OF DRAWINGS

FIG. 1 is a view showing a schematic configuration of a highly heat-dissipating flexible printed circuit board (GFPCB) according to one embodiment of the present invention.

FIG. 2 is an exemplary using view of the present invention.

FIGS. 3a and 3b are views showing configurations of a conventional flexible circuit board (FPCB).

FIG. 6 is a flowchart explaining a method of manufacturing the highly heat-dissipating flexible printed circuit board (GFPCB) according to one embodiment of the present invention.

FIG. 7 is a flowchart explaining steps for manufacturing a flexible board layer of FIG. 6.

FIG. 8 is a view showing a schematic configuration of a vehicular LED lamp according to one embodiment of the present invention.

FIG. 9 is a view comparing a lamination structure of the highly heat-dissipating flexible printed circuit board (GFPCB) with a lamination structure of a conventional FPCB according to one embodiment of the present invention.

FIGS. 10 and 11 are views showing a mounting example of the conventional FPCB.

FIGS. 12 to 14 are views showing mounting examples of the vehicular LED lamps of FIG. 8 according to one embodiment of the present invention.

FIGS. 15 to 17 are views showing mounting examples of LED lamps installed with the conventional FPCBs.

BEST MODE

Figure 4:
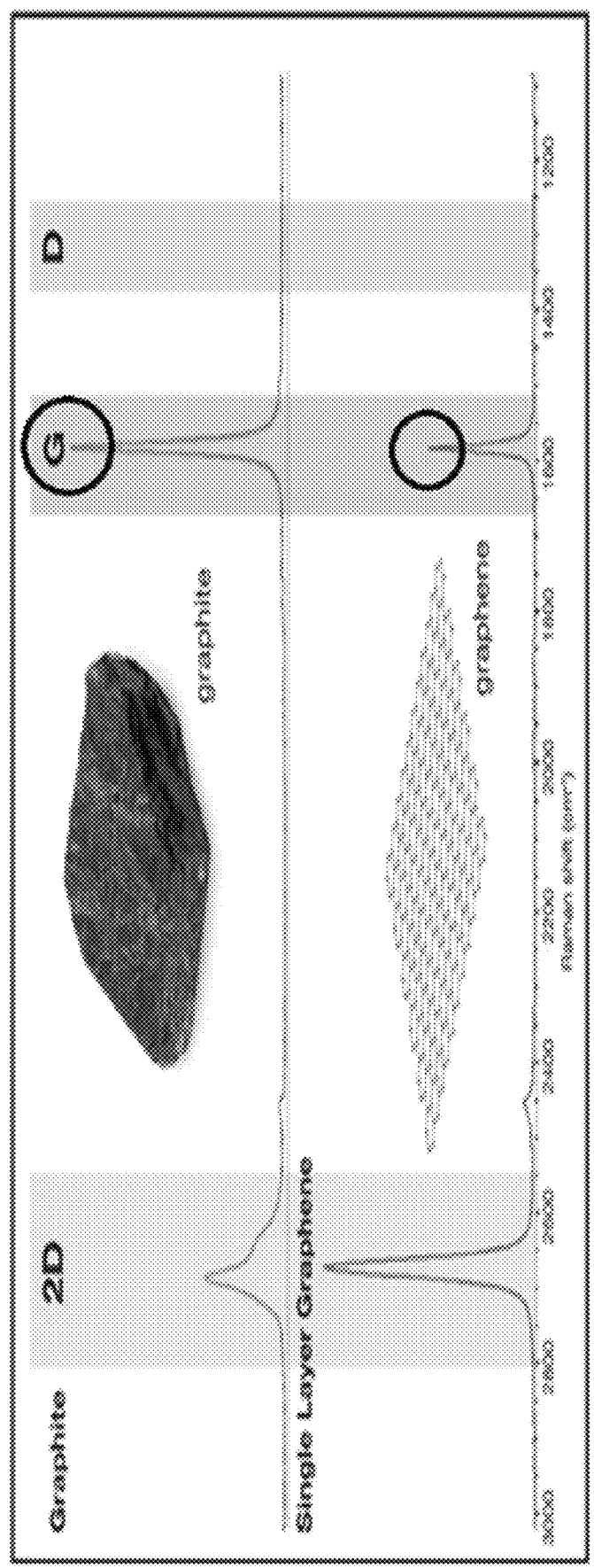
FIGS. 4 and 5 are graphs showing spectroscopic tables using Raman microscopy.

The detailed description of the present invention described later refers to the accompanying drawings for illustrating specific embodiments by way of example in which the invention may be carried out. The embodiments are described in detail enough to enable those skilled in the art to carry out the invention. It will be understood that the various embodiments of the present invention may be different from each other but need not be mutually exclusive. For example, the particular shapes, structures, and features described herein may be embodied in other embodiments without departing from the idea and scope of the invention in connection with one embodiment. In addition, it will be understood that the location or arrangement of an individual element within each disclosed embodiment may be modified without departing from the idea and scope of the present invention. Accordingly, the following detailed description is not intended to disclose a limited meaning, and the scope of the invention is limited only by the appended claims, along with the full scope of equivalents to which the claims are entitled, if properly explained. Similar reference numerals in the drawings refer to the same or similar function throughout several aspects.

Hereinafter, exemplary embodiments of the present invention will be described in more detail with reference to the accompanying drawings.

FIG. 1 is a view showing a schematic configuration of a highly heat-dissipating flexible printed circuit board (GFPCB) according to one embodiment of the present invention.

Referring to FIG. 1, the highly heat-dissipating flexible printed circuit board (GFPCB) 10 according to one embodiment of the present invention includes a flexible board layer 100 and a heat dissipation layer 200.

The flexible board layer 100 is formed in a flexibly bendable thin-film form by bonding a polyimide (PI) film to the lower side of a copper (Cu) film using an adhesive, has a heat element (for example, LED chips or other heat sources) installed on an upper side thereof (see FIG. 2), and is bonded to a lower side of the flexible board layer by using a pressure sensitive adhesive (PSA).

The flexible board layer 100 formed of a layer such as a copper film (Cu) and polyimide (PI) may have no suitable way for dissipating heat generated by a heat element such as an LED, without a heat sink serving as a heat dissipation member.

Accordingly, in the conventional printed circuit board, a thick aluminum heat dissipation member is required to be connected and installed on the lower side of the circuit board in order to more efficiently dissipate the heat generated by the heat element.

In the present invention, a heat dissipation layer 200, described later, in the form of a thin film is bonded to the lower side of the flexible board layer 100, such that the heat transferred from the heat element may be dissipated more efficiently.

In one embodiment, the flexible board layer 100 may include a copper layer 110, a cover layer 120, and a polyimide layer 130.

The copper layer 110 is formed of a copper (Cu) film, covered with the cover layer 120 on an upper side thereof, and bonded with the polyimide layer 130 on a lower side thereof by using an adhesive.

The cover layer 120 covers the upper side of the copper layer 110 to form an upper outer cover of the present invention.

The polyimide layer 130 is formed of a polyimide (PI) film and bonded to the lower side of the copper layer 110 by using an adhesive.

The flexible board layer 100 having the above-described configuration may further include a graphite powder layer or graphitic carbon layer using binder between the polyimide layer 130 and the pressure sensitive adhesive for bonding the heat dissipation layer 200 to the lower side of the polyimide layer 130, so that the conduction efficiency of heat transferred from the polyimide layer 130 to the heat dissipation layer 200 may be improved.

The heat dissipation layer 200 is formed in a thin-film form by coating any one of graphitic carbon and a graphite powder binder on the upper side of an aluminum (Al) film and bonded to the lower side of the flexible board layer 100 by using a pressure sensitive adhesive (PSA) to receive heat generated and transferred from the heat element and emit the heat to the outside.

It is preferable that the heat dissipation layer 200 according to the present invention may be formed of a thin film manufactured by coating any one of graphitic carbon and graphite powder binder on an upper side of an aluminum (Al) film, instead of forming the thin film by coating a copper (Cu) film with graphitic carbon, so as to improve the heat conduction performance.

In one embodiment, the heat dissipation layer 200 may include an aluminum layer 210 and a graphitic carbon layer 220 or a graphite powder layer using binder (not shown in the drawings for convenience of description).

The aluminum layer 210 is formed of an aluminum (Al) film, and coated with any one of the graphitic carbon layer 220 and the graphite powder binder on the upper side thereof to form one thin film.

The graphitic carbon layer 220 is formed by coating graphitic carbon on the upper side of the aluminum layer 210, or formed by coating graphite powder on the upper side of the aluminum layer 210 using binder.

In the case of the conventional heat dissipation member constituting a heat sink only with aluminum, the aluminum (Al) layer is required to be formed thickly for heat dissipation like the FPCB shown in FIGS. 3a and 3b in order to expand the heat dissipation area, or aluminum is required to be processed to form a separate blade (820 in FIG. 3b) in order to expand the heat dissipation area.

The description related to the conventional FPCB will be described with reference to FIG. 9.

Accordingly, the heat dissipation layer 200 according to the present invention, as a low-cost heat dissipation composite material forming a graphitic carbon layer (GCL) or a combination of graphite powder and binder (GB) that have high adhesion strength and high thermal conductivity, may be formed of a thin film to solve the above-mentioned disadvantages of the conventional aluminum heat dissipation member, so that processability can be facilitated and high thermal conductivity properties can be improved.

Accordingly, the heat dissipation layer 200 may effectively receive the heat transferred through the flexible board layer 100 from the LED chips or other heat sources and dissipate the heat to the outside, so that the expensive, thick and heavy aluminum heat dissipation member may be replaced as described above, thereby manufacturing the thinner printed circuit board, and the heat may be dissipated more efficiently, thereby improving durability of the LED chips and other heat sources.

However, the heat dissipation layer 200 according to the present invention is formed as the thin-film by coating the graphitic carbon or the graphite powder (GB: graphite powder+binder) on the upper side of the aluminum (Al) film, instead of forming the thin film by coating a copper (Cu) film with graphitic carbon, so as to improve the heat conduction performance.

Figure 5:
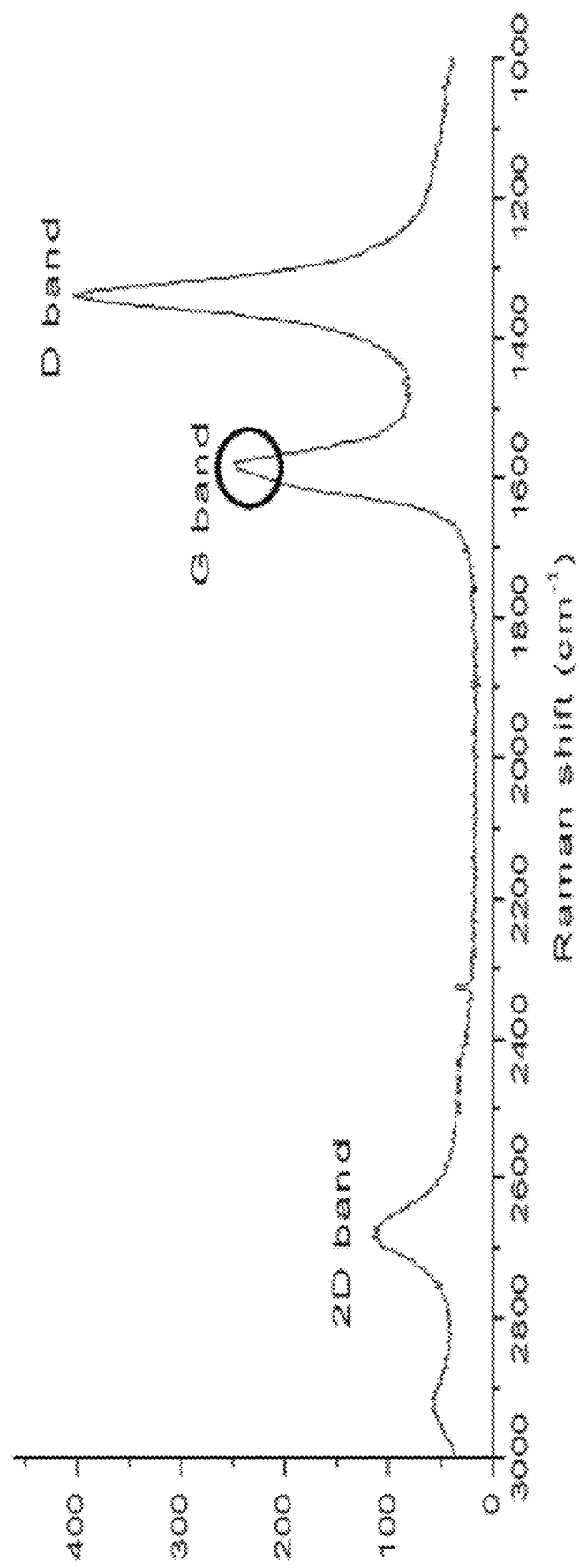

Referring to FIGS. 4 and 5 that represent spectroscopic diagrams using Raman microscopy (spectroscopy using a laser-based microscopic device), it is seen that a graphitic carbon layer (G band) is formed.

According to the highly heat-dissipating flexible printed circuit board (GFPCB) 10 having the above-described configuration, the flexible board layer 100 and the heat dissipation layer 200 may be bonded to each other by a hot press.

The highly heat-dissipating flexible printed circuit board (GFPCB) 10 manufactured according to the present invention may be easily bent without the help of a forced bending device for bending corresponding to a shape of the heat element to be attached as shown in FIG. 2, so that various processing can be facilitated as needed.

The highly heat-dissipating flexible printed circuit board (GFPCB) 10 having the above-described configuration uses the thin-film heat dissipation layer 200 instead of a voluminous, expensive and heavy aluminum heat dissipation plate, so that the heat transferred to the flexible board layer 100 from the heat sources such as the LEDs may be efficiently dissipated, and the thickness of the heat dissipation layer may be remarkably reduced even at a low cost.

In addition, the freely deformable thin-film heat dissipation layer 200 is used instead of aluminum unsuitable for the process such as bending, so that deformation processing may be easily performed according to shapes of devices to be applied, so as to be applied, instead of the FPCB, to all heat-generating products including heat dissipation countermeasures for small electronic appliances such as smartphones, LCD/OLED module, or medium/large electronic appliances such as laptops, TVs, and monitors, and products including vehicular head lamps, daytime running lamps or rear combination lamps.

FIG. 6 is a flowchart explaining a method of manufacturing the highly heat-dissipating flexible printed circuit board (GFPCB) according to one embodiment of the present invention.

Referring to FIG. 6, in the manufacturing method for the highly heat-dissipating flexible printed circuit board (GFPCB) according to one embodiment of the present invention, first, a polyimide (PI) film is bonded to the lower side of the copper (Cu) film using an adhesive, thereby manufacturing a flexible board layer 100 in the form of a thin film flexibly bent (S110).

The flexible board layer 100 manufactured in the above-described step S110 is formed in a flexibly bendable thin-film form by bonding a polyimide (PI) film to the lower side of a copper (Cu) film using an adhesive, and has a heat element (for example, LED chips or the like) installed on an upper side thereof (see FIG. 2), and the heat dissipation layer 200 may be bonded to the lower side thereof by using a pressure sensitive adhesive (PSA) through step S130 described later.

The heat dissipation layer 200 in the form of a thin film is manufactured by coating any one of graphitic carbon and graphite powder binder (GB: graphite powder+binder) on the upper side of the aluminum (Al) film (S120).

The heat dissipation layer 200 manufactured through the above-described step S120 may be formed in a thin-film form by coating any one of graphitic carbon and a graphite powder binder on the upper side of an aluminum (Al) film and bonded to the lower side of the flexible board layer 100 by using a pressure sensitive adhesive (PSA) to heat generated and transferred from the heat element and emit the heat to the outside.

Accordingly, the heat dissipation layer 200 may effectively receive the heat transferred through the flexible board layer 100 from the heat element and dissipate the heat to the outside, so that the aluminum heat dissipation member may be replaced as described above, thereby manufacturing the thinner printed circuit board, and the heat may be dissipated more efficiently, thereby improving durability of the heat element.

The heat dissipation layer 200 manufactured in the above-described step S110 is bonded to the lower side of the flexible board layer 100 manufactured in the above-described step S110 by using the pressure sensitive adhesive (PSA) (S130).

The manufacturing method for the highly heat-dissipating flexible printed circuit board (GFPCB) having the above-described steps may include the step of bonding the layers by using a hot press (a device for sandwiching plywood or the like between hot plates and applying pressure and heat).

The highly heat-dissipating flexible printed circuit board (GFPCB) 10 manufactured by the manufacturing method for the highly heat-dissipating flexible printed circuit board (GFPCB) having the above-described steps may be easily bent without the help of a forced bending device for bending corresponding to a shape of the heat element to be attached, so that various processing can be fabricated as needed. The thin-film heat dissipation layer 200 is used instead of a voluminous, expensive and heavy aluminum heat dissipation plate, so that the heat transferred to the flexible board layer 100 from the heat sources such as the LEDs may be efficiently dissipated, and the thickness and weight of the heat dissipation layer may be remarkably reduced even at a low cost.

In addition, the freely deformable thin-film heat dissipation layer 200 is used instead of aluminum unsuitable for the process such as bending, so that deformation processing may be easily performed according to shapes of devices to be applied, so as to be applied, instead of the FPCB, to all heat-generating products including heat dissipation countermeasures for small electronic appliances such as smartphones, LCD/OLED module, or medium/large electronic appliances such as laptops, TVs, and monitors, and products including vehicular head lamps, daytime running lamps or rear combination lamps.

FIG. 7 is a flowchart explaining steps for manufacturing a flexible board layer of FIG. 6.

Referring to FIG. 6, in the step of manufacturing the flexible board layer (S110), first, a copper layer 110 formed of a copper (Cu) film is prepared (S111).

The cover layer 120 is covered on the upper side of the copper layer 110 prepared in the above-described step S111 (S112).

The cover layer 120 on the upper side of the copper layer 110 covers the upper side of the copper layer 110 so that an upper outer cover of the present invention may be formed.

When the cover layer 120 covers the upper side of the copper layer 110 in the above-described step S112, the polyimide (PI) film is bonded to the lower side of the copper layer 110 by using an adhesive, thereby completing the flexible board layer 100 (S113).

The step (S110) of manufacturing the flexible board layer having the above-described steps may further include a graphitic carbon layer or a graphite powder (GB: graphite powder+binder) layer using binder between the polyimide layer 130 and the pressure sensitive adhesive for bonding the heat dissipation layer 200 to the lower side of the polyimide layer 130, so that the conduction efficiency of the heat transferred from the polyimide layer 130 to the pressure sensitive adhesive may be improved.

In the step (S110) of manufacturing the flexible board layer having the above-described steps, the layers may be bonded by using a hot press (a device for sandwiching plywood or the like between hot plates and applying pressure and heat).

FIG. 8 is a view showing a schematic configuration of a vehicular LED lamp according to one embodiment of the present invention.

Referring to FIG. 8, the vehicular LED lamp according to one embodiment of the present invention includes a highly heat-dissipating flexible circuit board (GFPCB) 300, a base housing 400, an LED module 500, a dispersion plate 600, and a cover 700.

The highly heat-dissipating flexible circuit board (GFPCB) 300 includes: a flexible board layer formed in a flexibly bendable thin-film form by bonding a polyimide (Pl) film to the lower side of a copper (Cu) film using an adhesive, in which an LED is installed on an upper side thereof, and the heat dissipation layer 200 is bonded to a lower side thereof by using a pressure sensitive adhesive (PSA); and a heat dissipation layer formed in a thin-film form by coating any one of graphitic carbon and a graphite powder binder on the upper side of an aluminum (Al) film and bonded to the lower side of the flexible board layer 100 by using a pressure sensitive adhesive (PSA) to receive heat generated from the LED and radiate the heat to the outside.

Since components for each layer of the highly heat-dissipating flexible printed circuit board (GFPCB) 300 are the same as the components of the highly heat-dissipating flexible printed circuit board (GFPCB) 10 of FIG. 1, the duplicate description will be omitted.

The base housing 400 is formed in a front or rear of the vehicle corresponding to a position installed therein with the vehicle lamp so as to form a space for installing the lamp in the vehicle, in which the highly heat-dissipating flexible circuit board (GFPCB) 300 is installed in the space, and the space is covered by the cover 700.

In other words, the base housing 400 forms a space for installing a head lamp or tail lamp, that is, a daytime running lamp (DRL) or rear combination lamp (RCL) of the vehicle.

The LED module 500 is provided with a plurality of LEDs emitting light, and installed on a front surface of the highly heat-dissipating flexible circuit board (GFPCB) 300.

The heat generated upon the light irradiation of the LED is effectively emitted by the highly heat-dissipating flexible circuit board (GFPCB) 300, so that the LED module 500 may be prevented from being heated beyond the usable temperature range, thereby preventing a defect or the like.

The dispersion plate 600 is installed at a front end of the LED module (500), such that the light emitted from the LED may be dispersed in order to prevent glare or the like.

In one embodiment, the dispersion plate 600 may be used as a device for collecting or dispersing light according to the design, or may be removed according to the timing.

The cover 700 covers the space formed by the base housing 400 while transmitting the light dispersed by the dispersion plate 600.

The vehicular LED lamp having the above-described configuration may be applied to the head lamp for illuminating the front or rear of the vehicle, and the daytime running lamp (DRL) or rear combination lamp (RCL) as in FIGS. 12 to 14.

FIG. 9 is a view comparing a lamination structure of the highly heat-dissipating flexible printed circuit board (GFPCB) according to one embodiment of the present invention with a lamination structure of a conventional FPCB.

Referring to FIG. 9, it can be seen in the lamination structure of the conventional FPCB that the polyimide (PI) film is 25, the adhesive tape is 70 to 150, and the aluminum layer for the heat dissipation plate 820 is 1,000 to 1,500 as shown in FIG. 11.

In contrast, the highly heat-dissipating flexible printed circuit board (GFPCB) 10 according to one embodiment of the present invention corresponding to the lamination structure of the conventional FPCB may be foiled such that the polyimide (PI) film is 12.5, the bonding adhesive is 9, and the GCL+aluminum heat dissipation layer is 50 to 80.

The cover layer, the adhesive layer, the copper (Cu) layer, and the adhesive layer positioned on the upper side are laminated in the same way as the conventional FPCB, however, the polyimide (PI) film and the adhesive layer may be formed to be significantly thinner than the conventional FPCB.

In addition, the conventional FPCB has the aluminum heat dissipation plate in the form of a blade as shown in FIG. 10 to increase the heat dissipation area, however, the present invention may be manufactured to have 1/20 of the thickness in the related art as shown in FIG. 9, so that the overall structural volume can be remarkably reduced.

FIGS. 10 and 11 are views showing a mounting example of the conventional FPCB.

FIG. 10 shows that the Al heat dissipation plate 820 is attached to the lower side of the FPCB 810 by an adhesive scheme, and the LED 830 is installed on the upper side of the FPCB 810. FIG. 11 is a view in which the FPCB 810 is mounted on a plate 840 having a stepped structure.

The FPCB 810 refers to a flexible PCB, and generally signifies a wiring board using a flexible insulating board.

FIGS. 15 to 17 are views showing mounting examples of the LED lamp in which the conventional FPCB of FIG. 10 is installed. It can be seen that the Al heat dissipation plate 820 is formed on the lower side of the FPCB 810 unlike FIGS. 12 to 14.

Although the methods have been described with reference to the embodiments of the present invention, it will be apparent to a person having ordinary skill in the art that various modifications and variations can be made in the present invention without departing from the scope and field of the following appended claims.

DESCRIPTION OF REFERENCE NUMERALS

10, 300: Highly heat-dissipating flexible printed circuit board (GFPCB
20: LED lamp for vehicle
100: Flexible board layer
110: Copper layer
120: Cover layer
130: Polyimide layer
200: Heat dissipation layer
210: Aluminum layer
220: Graphitic carbon layer
400: Base housing
500: LED module
600: Dispersion plate
700: Cover
810, 820: Al heat dissipation plate
830: LED
840: Plate

What is claimed is:

1. A highly heat-dissipating flexible printed circuit board (GFPCB) comprising:
    a flexible board layer comprising a polyimide (PI) film that is bonded to a lower side of a copper (Cu) film using an adhesive, the flexible board layer having a heat element installed on an upper side thereof
    a heat dissipation layer comprising any one of graphitic carbon or graphite powder binder that is (a) coated on an upper side of an aluminum (Al) film and (b) bonded to a lower side of the flexible board layer using a pressure sensitive adhesive (PSA) to receive heat generated and transferred from the heat element and;
    a graphite powder layer that comprises a binder and that is positioned between the Pl film and the PSA.

2. The highly heat-dissipating flexible printed circuit board (GFPCB) of claim 1, wherein the flexible board layer includes:
    a cover layer covering an upper side of the copper film.

3. The highly heat-dissipating flexible printed circuit board (GFPCB) of claim 1, wherein the heat dissipation layer includes:
    graphitic carbon on the upper side of the aluminum film.

4. A vehicular LED lamp comprising:
    the highly heat-dissipating flexible printed circuit board (GFPCB) according to claim 1;
    a base housing forming a space for installing a lamp in a vehicle, and installed with the highly heat-dissipating flexible circuit board (GFPCB) in the space;
    an LED module provided with a plurality of LEDs, and installed on a front surface of the highly heat-dissipating flexible circuit board (GFPCB);
    a dispersion plate installed at a front end of the LED module to disperse light emitted from the LED module; and
    a cover for covering the space formed by the base housing while transmitting the light dispersed by the dispersion plate.

5. A vehicular LED lamp comprising:
    the highly heat-dissipating flexible printed circuit board (GFPCB) according to claim 2;
    a base housing forming a space for installing a lamp in a vehicle, and installed with the highly heat-dissipating flexible circuit board (GFPCB) in the space;
    an LED module provided with a plurality of LEDs, and installed on a front surface of the highly heat-dissipating flexible circuit board (GFPCB);
    a dispersion plate installed at a front end of the LED module to disperse light emitted from the LED module; and
    a cover for covering the space formed by the base housing while transmitting the light dispersed by the dispersion plate.

6. A vehicular LED lamp comprising:
    the highly heat-dissipating flexible printed circuit board (GFPCB) according to claim 4;
    a base housing forming a space for installing a lamp in a vehicle, and installed with the highly heat-dissipating flexible circuit board (GFPCB) in the space;
    an LED module provided with a plurality of LEDs, and installed on a front surface of the highly heat-dissipating flexible circuit board (GFPCB);
    a dispersion plate installed at a front end of the LED module to disperse light emitted from the LED module; and a cover for covering the space formed by the base housing while transmitting the light dispersed by the dispersion plate.

7. A method for manufacturing a highly heat-dissipating flexible printed circuit board (GFPCB), the method comprising:
   manufacturing a flexible board layer in a form of a flexibly bent thin film by bonding a polyimide (PI) film to a lower side of a copper (Cu) film using an adhesive;
   manufacturing a heat dissipation layer in a form of a thin film by coating any one of graphitic carbon or graphite powder binder on an upper side of an aluminum (Al) film;
   using a binder to form a graphite powder layer between the polyimide film of the flexible board layer and a pressure sensitive adhesive; and
   bonding the heat dissipation layer to a lower side of the flexible board layer by using the pressure sensitive adhesive (PSA).

8. The method of claim 7, wherein manufacturing the highly heat-dissipating flexible printed circuit board includes:
   forming a cover layer on an upper side of the copper film.

9. The method of claim 7, wherein the heat dissipation layer includes:
   graphitic carbon on the upper side of the aluminum film.

* * * * *